July 12, 1966 M. COOPERMAN 3,260,862

TUNNEL DIODE CIRCUIT

Filed March 9, 1964

INVENTOR.
MICHAEL COOPERMAN

BY John V. Regan

Attorney

United States Patent Office 3,260,862

Patented July 12, 1966

3,260,862

TUNNEL DIODE CIRCUIT

Michael Cooperman, Cherry Hill, N.J., assignor to Radio Corporation of America, a corporation of Delaware Filed Mar. 9, 1964, Ser. No. 350,222
6 Claims. (Cl. 307—88.5)

This invention relates to tunnel diode circuits.

It is an object of this invention to provide a new and improved tunnel diode switching circuit.

It is another object of this invention to provide a new and improved tunnel diode switching circuit which may be operated as an EXCLUSIVE OR circuit. A circuit which performs an EXCLUSIVE OR logic function produces an output signal when one and only one of a number of possible input signals is present.

It is a further object of this invention to provide a tunnel diode EXCLUSIVE OR circuit which also exhibits a bistable state storage capability.

A circuit in accordance with the invention includes first and second serially connected tunnel diodes. Each of the diodes exhibit relatively low and relatively high voltage operating regions, separated by an intermediate voltage negative-resistance region through which the operating points of the diodes may be switched. Means are provided for quiescently operating each of the first and second tunnel diodes in its low voltage region. In operation, input signals of a plurality of threshold levels are applied to the series combination of the diodes. An input signal of a first threshold level is insufficient to switch either of the diodes to the high voltage region, whereas an input signal of a second threshold level is sufficient to switch the first tunnel diode to its high voltage region but not the second tunnel diode. A clock signal is periodically applied to the second tunnel diode so that the clock signal adds to an input signal of the first threshold level to switch the second tunnel diode to the high voltage region to produce an output signal. However, the clock signal is prevented from adding to an input signal of the second threshold level and thus does not switch the second tunnel diode when such a level is present. This is because the first tunnel diode is switched to its high voltage region by the occurrence of the second threshold level input signal. The first tunnel diode, by operating in its high voltage region, blocks the second threshold level input signal from appearing at the second tunnel diode and thus prevents the clock signal from switching this diode.

Further, the switching circuit may be operated as an EXCLUSIVE OR logic circuit. The high and the low voltage operating regions of the tunnel diodes represent, respectively, a binary "1" and a binary "0." A binary "1" input signal and a binary "0" input signal applied together effectively provide a first threshold level signal whereas a pair of binary "1" input signals provide a second threshold level signal. The operating state of the second tunnel diode provides a binary output signal of either the "1" or "0" levels.

In EXCLUSIVE OR operation, the application of a pair of binary "0" input signals to the series combination of the diodes, and a clock signal to the second diode alone, causes neither diode to switch to its high voltage region. Therefore, a binary "0" output signal is derived from the circuit. The application of a binary "1" and a binary "0" input signal causes the second tunnel diode to switch to its high voltage region upon the occurrence of a clock signal. Thus, a binary "1" output signal is derived from the circuit. The application of a pair of binary "1" input signals causes the first tunnel diode to switch to its high voltage state. The first tunnel diode thereupon blocks the application of the input signals to the second tunnel diode. The clock signal does not add to these input signals and consequently the second tunnel diode does not switch to its high voltage region. A binary "0" output signal is therefore derived from the circuit. Prior to each clock signal, a reset signal is applied to the serial combination of the diodes to reset them both to their low voltage regions.

Figure 1:
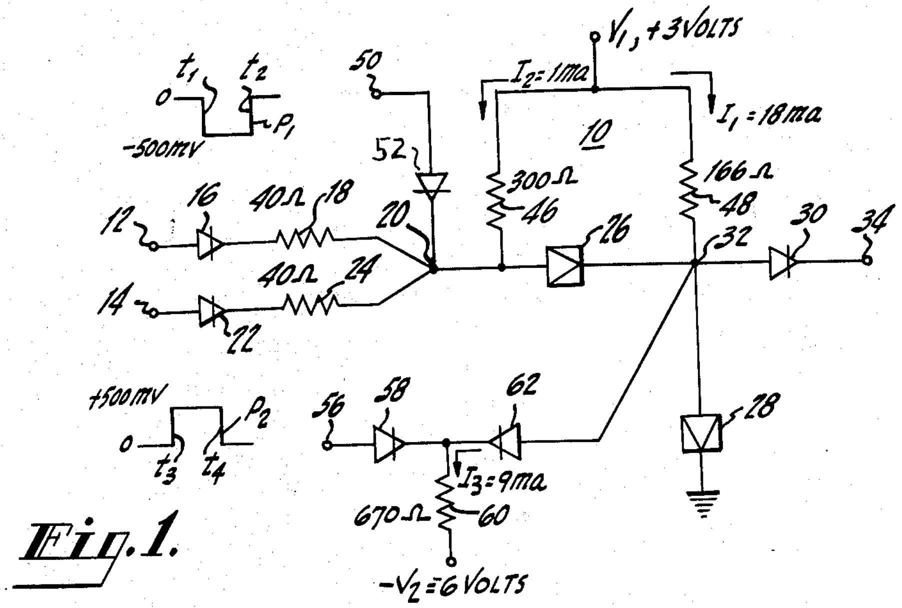
FIGURE 1 is a schematic circuit diagram of a tunnel diode circuit in accordance with the invention.

In FIGURE 1, a tunnel diode logic circuit 10 includes a pair of input terminals 12 and 14. A tunnel rectifier 16 and a resistor 18 are serially connected between the input terminal 12 and a junction point 20. Similarly, a tunnel rectifier 22 and a resistor 24 are also connected in series between the input terminal 14 and the junction point 20. The tunnel rectifier anodes are connected, respectively, to input terminals 12, 14. First and second tunnel diodes 26 and 28 are serially connected together, cathode-to-anode, respectively, between the junction point 20 to which the anode of tunnel diode 26 is connected and ground in the circuit 10. A tunnel rectifier 30 is connected between the junction 32 of the diodes 26 and 28 and an output terminal 34 for the circuit 10, poled with the cathode connected to terminal 34.

Figures 2, 3:
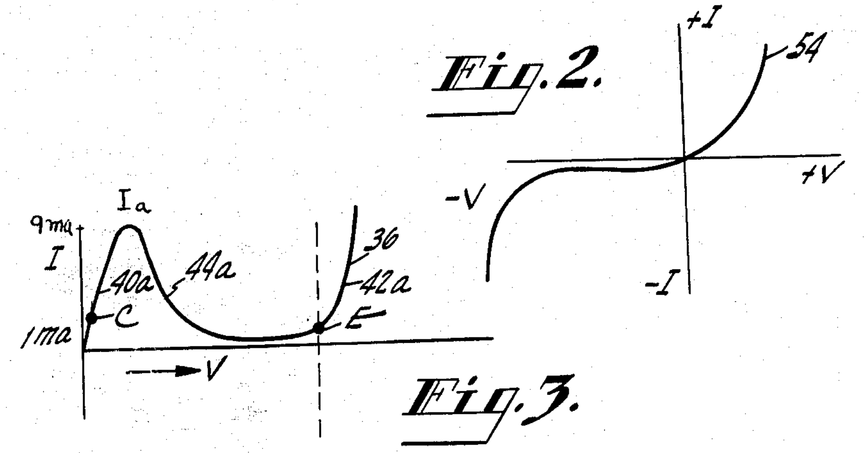
FIGURE 2 is a graph illustrating the current-voltage characteristic of a tunnel rectifier; and, FIGURES 3 and 4 are graphs illustrating the current-voltage characteristics of the tunnel diodes utilized in the schematic circuit diagram of FIGURE 1.
Figure 4:
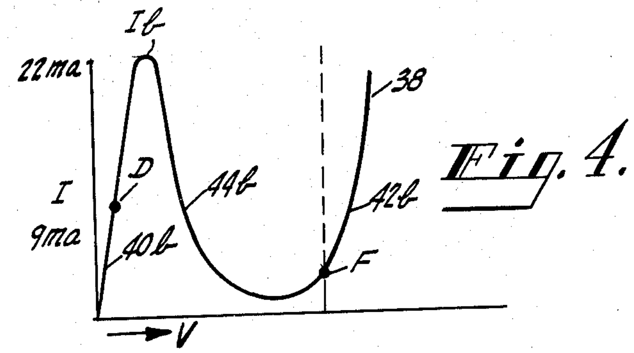

In FIGURES 3 and 4 are shown the characteristic curves 36 and 38, respectively, of the tunnel diodes 26 and 28. Each of the characteristic curves 36 and 38 exhibit relatively low voltage (**40*a* and 40*b*, respectively) and relatively high voltage (42*a* and 42*b*, respectively) operating regions. The low and high voltage operating regions of the characteristic curves 36 and 38 respectively comprise positive-resistance regions and are joined by intermediate voltage negative-resistance regions 44*a* and 44*b***, respectively.

The first tunnel diode 26 is biased to operate quiescently in the low voltage region **40*a* of its current-voltage characteristic, such as at the point C, by means of a biasing resistor 46 coupled from the anode of the diode 26 to a source of positive potential $V_1$. The biasing resistor 46 is not essential but it makes operation more reliable in some cases. Similarly, the second tunnel diode 28 is biased to operate quiescently in the low voltage region 40*b* of its current-voltage characteristic, such as at the point D, by means of a load resistor 48 coupled from the anode of the diode 28 to the source of positive potential $V_1$. The diodes 26 and 28 operate in their low voltage region until an input current exceeds the current peak points $I_a$ and $I_b$, respectively. When the current peak points are exceeded, the operating points of the diodes 26 and 28** are switched through the negative-resistance region to operate in the high voltage operating regions, such as at the points E and F, respectively.

The diodes 26 and 28 are reset to their low voltage operating regions by a negative reset pulse $P_1$ applied to a reset terminal 50 (FIGURE 1). The terminal 50 is coupled through a tunnel rectifier 52 to the junction point 20 to which the cathode of tunnel rectifier 52 is connected, and thus to the serial combination of the diodes 26 and 28. The operation of a tunnel rectifier may be understood by referring to FIGURE 2 which illustrates the current-voltage characteristic of a tunnel rectifier. Tunnel rectifiers have been described, for example, in an article by Lesk et al. appearing in the 1959 IRE Wescon Convention Record, part III, page 9. In the article, the tunnel rectifier is referred to as a "backward diode" but the device has since become more commonly known as a "tunnel rectifier." The current-voltage characteristic curve 54 for a tunnel rectifier exhibits a low impedance for applied forward biasing voltages but an extremely high impedance for low reverse biasing voltages. At high reverse voltages, on the order of 500 millivolts, a tunnel rectifier breaks down and presents a low impedance to reverse conduction. Tunnel rectifiers are essentially unidirectional conducting devices for low applied voltages. Thus, in two-terminal tunnel diode circuits, the tunnel rectifiers introduce the desired directionality for input and output signals.

A clock pulse $P_2$ is also applied to the logic circuit 10 via a clock terminal 56. The terminal 56 is coupled through a tunnel rectifier 58 (poled with its anode connected to terminal 56) and a resistor 60 to a source of negative potential $-V_2$. The anode of the second tunnel diode 28 is also coupled through a tunnel rectifier 62 to the junction of the resistor 60 and the rectifier 58.

The pulses $P_1$ and $P_2$ may, for example, each be one nano-second in duration and are applied so that the leading edge of the pulse $P_2$ occurs after the trailing edge of the pulse $P_1$. This insures that the diodes 26 and 28 are reset by the pulse $P_1$ before the clock pulse $P_2$ is applied.

When operating as an EXCLUSIVE OR circuit, the logic circuit 10 exhibits an output signal when one and only one of the two input signals is present. Input signals may, for example, be derived from previous tunnel diode circuits and an input signal of 500 millivolts positive to ground comprises a binary "1" signal, whereas an input signal of 50 millivolts positive to ground comprises a binary "0" signal. The 500 and 50 millivolt levels comprise the voltages exhibited by a tunnel diode such as the tunnel diode 28 when operating in the high voltage operating region **42*b* and the low voltage operating region 40*b***, respectively (FIGURE 4).

The tunnel diodes 26 and 28 are biased to operate quiescently at the points C and D, respectively, in their low voltage regions (FIGURES 3 and 4). For the values of components shown in FIGURE 1, the current through the diode 26 when operating at the point C is 1 milliampere whereas the current through the diode 28 when operating at the point D is 10 milliamperes. The peak current $I_a$ of the diode 26 is 9 milliamperes, whereas the peak current $I_b$ of the diode 28 is 22 milliamperes. Thus, to switch the bistably biased diode 26 to operation at the high voltage point E (FIGURE 3) requires an increase in current therein of greater than 8 milliamperes. Similarly, to switch the bistably biased diode 28 to operation at the high voltage point F requires an increase in current therein of greater than 12 milliamperes.

In describing the operation of the tunnel diode logic circuit 10, it will be assumed that a pair of binary "0" input signals are applied to the input terminals 12 and 14. A reset pulse $P_1$ is applied to the reset terminal 50. The negative reset pulse $P_1$ exhibits an amplitude of $-500$ millivolts which is sufficient to break down the tunnel rectifier 52 and cause it to operate in its reverse breakdown state. Consequently, a negative pulse is applied to the serially connected diodes 26 and 28 to reset the diodes to their low voltage operating state if initially in the high voltage state. The two binary "0" input signals do not increase the current through the diodes 26 and 28. The diodes 26 and 28 are connected in series for input signals but not for biasing signals. Thus, with binary "0" input signals, the tunnel diode 28 is operating at the low voltage point D (FIGURE 4) at the time the clock signal pulse $P_2$ is applied to the terminal 56. The pulse $P_2$, which exhibits an amplitude of 500 millivolts, is coupled through the tunnel rectifier 58 to reverse bias and cut off the oppositely poled tunnel rectifier 62. Consequently, the current $I_3$ of 9 milliamperes formerly flowing through the rectifier 62 is steered through the second tunnel diode 28. However, the addition of the current $I_3$ of 9 milliamperes to the quiescent current of 10 milliamperes of the diode 28 does not exceed the current peak of 22 milliamperes and the diode 28 does not switch from its low voltage operating point D. Thus, the application of two binary "0" input signals produces a binary "0" output signal.

The application of one binary "1" input signal of 500 millivolt and one binary "0" input signal causes an increased current to flow into the first tunnel diode 26. For the circuit of FIGURE 1 the increased current may, for example, comprise 6 milliamperes. This does not increase the current through the diode 26 sufficiently to cause it to exceed its current peak point $I_a$ of 9 milliamperes. Consequently, the first tunnel diode 26 remains operating in its low voltage state. The increased current through the diode 26 also flows through the serially connected second tunnel diode 28 increasing the current therethrough to approximately 16 milliamperes, which is below its current peak point $I_b$. The subsequent application of a clock pulse $P_2$ steers the current $I_3$ through the second tunnel diode 28 and causes the current through the tunnel diode 28 to increase above the value of its peak current point $I_b$. Consequently, the bistably biased diode 28 switches to its high voltage state, such as to the point F (FIGURE 4), to provide a binary "1" output signal at the output terminal 34. The diode 28 remains operating at the high voltage point F until reset even though the input signals are removed. Thus, the logic circuit 10 provides binary storage capability.

It is to be noted that a binary "1" and a binary "0" input signal is effectively a first threshold level signal which causes the second tunnel diode 28 to switch when a clock signal $P_2$ is also applied thereto.

The diode 28 is reset from its high voltage state by a reset pulse $P_1$ and it is now assumed that two binary "1" input signals are applied to the terminals 12 and 14. When two binary "1" input signals are applied to the input terminals 12 and 14, the current entering the junction point 20 from the input terminals is approximately double that of a single binary "1" input signal or substantially equal to 12 milliamperes. Consequently, the peak current point of the first tunnel diode 26 is exceeded but not the peak current point of the second tunnel diode 28. Therefore, the bistably biased first tunnel diode 26 switches to operate at the point E in its high voltage state (FIGURE 3). The switching of the first tunnel diode 26 to its high voltage state effectively reverse biases the tunnel rectifiers 16 and 22 and cuts off the input current to the second tunnel diode 28. Consequently, when the clock pulse $P_2$ steers the current $I_3$ through the second tunnel diode 28, there is insufficient current to cause the diode 28 to switch to its high voltage state. Thus, the diode 28 remains in its low voltage state to provide a binary "0" signal at the output terminal 34.

The two binary "1" input signals effectively comprise a second threshold level input signal which causes the first tunnel diode to switch to its high voltage state but not the second. This is because the peak current $I_a$ of the first tunnel diode 26 is lower than the peak current point $I_b$ of the second tunnel diode 28. The switching of the first tunnel diode 26 thereupon blocks the input signals from being applied to the second tunnel diode 28 and prevents it from switching when a clock signal $P_2$ is applied subsequently.

It is apparent that by changing the values of the components in the circuit 10 of FIGURE 1, tunnel diodes of equal peak current points could be utilized. Additionally, it is also apparent that the second tunnel diode 28 need not be bistably biased but may also be monostably biased if the storage capability of the circuit 10 is not desired.

It is to be noted that if one of the input terminals such as the terminal 14 is grounded, the circuit 10 may be operated as a shift register stage. The binary information signal applied to the other terminal 12 is shifted into and stored in the circuit 10. Furthermore, if one of the input terminals has applied thereto an input level of 500 millivolts, a binary information signal applied to the other terminal will be inverted and stored in the inverted form by the circuit 10.

Thus, in accordance with the invention, a relatively simple tunnel diode switching circuit which performs an EXCLUSIVE OR logic function is provided. The circuit uses relatively few components in contrast to prior art circuits. The circuit also exhibits the capability of binary storage.

What is claimed is:

1. An electrical circuit,
comprising in combination,
first and second serially connected tunnel diodes each exhibiting relatively low and high voltage operating regions corresponding to first and second binary levels, respectively,
input means coupled to the serial combination of said diodes for applying input signals of said first and second binary levels thereto,
means for quiescently operating said first and second tunnel diodes in their low voltage regions so that the application of a pair of binary signals of said second level switches said first tunnel diode to its high voltage region but not said second tunnel diode,
said first tunnel diode in its high voltage region providing isolation between said input means and said second tunnel diode to block the application of said binary signals to said second tunnel diode, and
means for applying to said second tunnel diode a clock signal having an amplitude to switch said second tunnel diode to its high voltage region when added to one binary signal of said second level in the absence of the switching of said first tunnel diode to its high voltage region.

2. A switching circuit,
comprising in combination,
first and second serially connected tunnel diodes each exhibiting a relatively high and a relatively low voltage operating region,
means for quiescently operating said first and second tunnel diodes in their low voltage regions,
input means for applying to said serially connected diodes input signals of a plurality of threshold levels,
an input signal of a first threshold level being insufficient to switch either of said diodes to their high voltage regions, and an input signal of a second threshold level being sufficient to switch said first tunnel diode to its high voltage region but not said second tunnel diode,
said first tunnel diode in its high voltage region providing isolation between said input means and said second tunnel diode to block the application of said threshold signals to said second tunnel diode, and
means for applying to said second tunnel diode a clock signal having an amplitude to switch said second tunnel diode to its high voltage region when added to a first threshold level signal,
said clock signal being prevented from adding to an input signal of said second threshold level by the switching of said first tunnel diode to its high voltage region.

3. An EXCLUSIVE OR circuit,
comprising in combination,
first and second serially connected tunnel diodes each exhibiting relatively low and high voltage operating regions corresponding to, respectively, binary "0" and binary "1" levels,
input means for applying binary input signals to the serial combination of said diodes,
means for quiescently operating said first and second tunnel diodes in their low voltage regions at operating points such that the application of at least a pair of binary "1" signals is sufficient to switch said first tunnel diode to its high voltage region but not said second tunnel diode,
said first tunnel diode in its high voltage region providing isolation between said input means and said second tunnel diode to block the application of binary input signals to said second tunnel diode, and
means for applying to said second tunnel diode a clock signal having an amplitude to switch said second tunnel diode to its high voltage region when added to one binary "1" signal in the absence of the switching of said first tunnel diode to its high voltage region.

4. A switching circuit,
comprising in combination,
first and second serially connected tunnel diodes each exhibiting relatively high and relatively low voltage operating regions separated by an intermediate voltage negative-resistance region,
said first and second tunnel diodes exhibiting at the junction of said low and intermediate voltage regions current peaks that must be exceeded to switch said diodes to operating in said high voltage operating region,
means for quiescently operating said first and second tunnel diodes in their low voltage regions such that the operating point of said first diode is closer to its current peak than the operating point of said second diode is to its current peak,
input means for applying to said serially connected diodes input signals of a plurality of threshold levels,
an input signal of a first threshold level causing neither of the operating points of said first and second diodes to exceed their current peaks, and an input signal of a second threshold level causing the operating point of said first tunnel diode, but not said second tunnel diode, to exceed its current peak to switch said first tunnel diode to its high voltage operating region,
said first tunnel diode in its high voltage region providing isolation between said input means and said second tunnel diode to block the application of said input signals to said second tunnel diode, and
means for applying a clock signal to said second tunnel diode,
said clock signal having an amplitude to switch said second tunnel diode to its high voltage region when added to an input signal of said first threshold level in the absence of the switching of said first tunnel diode to its high voltage region.

5. A switching circuit,
comprising in combination,
first and second serially connected tunnel diodes each exhibiting a relatively high and a relatively low voltage operating region,
means for quiescently operating said first and second tunnel diodes in their low voltage regions,
input means for applying across the serial combination of said diodes input signals of a plurality of threshold levels,
an input signal of a first threshold level being insufficient to switch either of said diodes to their high voltage regions, and an input signal of a second threshold level being sufficient to switch said first tunnel diode to its high voltage region but not said second tunnel diode,
said first tunnel diode in its high voltage region providing isolation between said input means and said second tunnel diode to block the application of said input signals to said second tunnel diode, and
means for applying to said second tunnel diode a clock signal of a value to switch said second tunnel diode when added to an input signal of said first threshold level in the absence of the switching of said first tunnel diode to its high voltage region.

6. An EXCLUSIVE OR circuit,
comprising in combination,
first and second serially connected tunnel diodes each exhibiting relatively low and high voltage operating regions corresponding to binary "0" and binary "1" levels, respectively, input means including first and second input terminals coupled to the serial combination of said diodes for applying binary input signals to said diodes, first means for biasing said first tunnel diode to operate quiescently in the low voltage region at a point that requires the application of a pair of binary "1" input signals to switch said first tunnel diode to its high voltage region, said first tunnel diode in its high voltage region providing isolation between said input means and said second tunnel diode to block the application of said binary input signals to said second tunnel diode, second means for biasing said second tunnel diode to operate quiescently in the low voltage region at a point that requires more than the application of one binary "1" input signal to switch said second tunnel diode to its high voltage region, and means for applying to said second tunnel diode a clock signal having an amplitude that when added to a binary "1" input signal switches said second tunnel diode to its high voltage region in the absence of the switching of said first tunnel diode to its high voltage region.

References Cited by the Examiner

UNITED STATES PATENTS

| | | | |
|---|---|---|---|
| 3,019,981 | 2/1962 | Lewin. | |
| 3,155,846 | 11/1964 | Parham | 307—88.5 |
| 3,165,643 | 1/1965 | Wehr | 307—88.5 |
| 3,166,682 | 1/1965 | Parham | 307—88.5 |
| 3,177,376 | 4/1965 | Wolterman | 308—88.5 |

OTHER REFERENCES

Page 55, 10/1961, Masher, Tunnel Diode NOR and NAND Circuits, IBM Technical Bulletin, vol. 4, No. 5.

Page 76, 5/1962, Akmenkalns, Odd-Even Circuits, IBM Technical Disclosure Bulletin, vol. 4, No. 12.

ARTHUR GAUSS, *Primary Examiner.*

I. C. EDELL, *Assistant Examiner.*